United States Patent [19]

Nishiura

[11] Patent Number: 4,931,873
[45] Date of Patent: Jun. 5, 1990

[54] PHOTOELECTRIC LINEAR IMAGE SENSOR HAVING MULTILAYER INSULATING LAYER TO REDUCE DEFECTS

[75] Inventor: Masaharu Nishiura, Matsumoto, Japan

[73] Assignee: Fuji Electric Co., Ltd., Kawasaki

[21] Appl. No.: 194,423

[22] Filed: May 13, 1988

[30] Foreign Application Priority Data

May 18, 1987 [JP] Japan .................................. 62-120886
Nov. 7, 1987 [JP] Japan .................................. 62-281881

[51] Int. Cl.⁵ .............................................. H04N 3/14
[52] U.S. Cl. .................................. 358/213.11; 358/482
[58] Field of Search ..................... 358/213.11, 213.31, 358/293, 294, 482, 483

[56] References Cited

U.S. PATENT DOCUMENTS

| | | | |
|---|---|---|---|
| 4,482,804 | 11/1984 | Oritsuki et al. .................. | 358/213.11 |
| 4,607,168 | 8/1986 | Oritsuki et al. .................. | 358/213.11 |
| 4,737,852 | 4/1988 | Dohkoshi et al. ............... | 358/213.11 |

FOREIGN PATENT DOCUMENTS 61-30069 12/1986 Japan .

Primary Examiner—Jin F. Ng
Assistant Examiner—Stephen Brinich
Attorney, Agent, or Firm—Brumbaugh, Graves, Donohue & Raymond

[57] ABSTRACT

An improved linear image sensor of the type having a plurality of linearly arranged photodetecting resistors of amorphous silicon film, leader electrodes individually connected thereto, striped matrix electrodes, and an insulating layer covering the striped matrix electrodes is provided. Each of said leader electrodes are in contact with each of said striped matrix electrodes via a hole formed by patterning in the insulating layer. The insulating layer is made up of a plurality of insulation films laminated one over another by repeating the steps of film forming and patterning. Thus, even though pinholes occur during deposition or patterning of individual layers, there is only a small probability that two or more pinholes will occur at the same place. The risk of short circuits caused by pinholes is therefore substantially reduced.

8 Claims, 3 Drawing Sheets

PHOTOELECTRIC LINEAR IMAGE SENSOR HAVING MULTILAYER INSULATING LAYER TO REDUCE DEFECTS

BACKGROUND OF THE INVENTION

The present invention relates to a contact image sensor having photoconductive detecting elements of amorphous silicon (a-Si) arranged in a linear array of approximately the same length as the object to be read.

A circuit for a conventional linear image sensor for matrix reading is shown in FIG. 2. The linear image sensor 10 is made up of photoconductive detecting elements 1 which are linearly arranged at a density of 8 elements, 12 elements, or 16 elements per millimeter. The total number of detecting elements in a linear image sensor for A-4 size paper is 1728 if it has 8 elements per millimeter. The 1728 elements are divided into 32 groups, each consisting of 54 elements. Positive electrodes of the 54 elements as a group are connected to first switches 20 in common. Negative electrodes at the corresponding positions in each group of the 54 elements are connected to second switches 30 in common. Therefore, the number of first switches 20 is 32 and the number of second switches 30 is 54. First switches 20 are connected to second switches 30 via a power source 40 (6-10 V) and a current detector 50. To achieve reading with this linear image sensor, the resistance of the individual elements 1 is measured consecutively by turning on and off second switches 30 sequentially, with one group of first switches 20 closed. If one of the detector elements 1 receives light, it decreases in resistance, permitting a current to flow through the detector 50. Without light, the detector element has a high resistance and prevents a current from flowing through the detector 50. Thus the detector elements 1 distinguish black parts from white parts on the original across which the linear image sensor 10 is passed.

A conventional linear image sensor based on amorphous silicon is constructed as shown in FIG. 3. There is shown a soda glass substrate 2 which is coated with an SiO$_2$ film 21 to hold back sodium. On the substrate 2 are formed matrix metal electrodes 31, 32, 33, 34 of chromium. (Only four electrodes are shown.) They are covered with a silicon nitride (SiN) film 4. These matrix electrodes are connected to second switches 30 shown in FIG. 2. On the substrate 2 is also formed an intrinsic amorphous silicon (a-Si) film 51. The intrinsic a-Si film 51 is connected to a metal electrode 6 via an n-type a-Si film 52. The metal electrode 6 is connected to switches 20 shown in FIG. 2. The intrinsic a-Si film 51 is connected also to metal electrodes 61, 62, 63, 64 via an n-type a-Si film 52. The lead electrodes 61, 62, 63, 64 are connected to the matrix electrodes 31, 32, 33, 34, respectively, via the contact hole 41 formed in the SiN film 4. The array of the photosensors is covered with a transparent protective film 71 of SiN or epoxy resin, and the matrix circuit is covered with an opaque protective film 72.

The conventional image sensor as mentioned above has a weak point arising from the fact that the leader electrodes 61, 62, 63, 64 come into contact with the matrix electrodes 31, 32, 33, 34, respectively, at as many as 1728 places in the case of an image sensor for A-4 size paper. Thus, the image sensor becomes defective even if it has only one short circuit caused by a pinhole defect in the insulation film 4. For this reason, the defective fraction of conventional image sensors is invariably higher than 50%. It is thus an object of the present invention to solve the above-mentioned problem and to provide a linear image sensor at a low fraction defective.

SUMMARY OF THE INVENTION

According to the present invention, there is provided a linear image sensor of the type having a plurality of linearly arranged photodetecting resistors of amorphous silicon film, leader electrodes individually connected thereto, striped matrix electrodes, and an insulating layer covering the striped matrix electrodes. Each of said leader electrodes are in contact with each of said striped matrix electrodes via a hole formed by patterning in the insulating layer. The insulating layer is made up of a plurality of insulation films laminated one over another by repeating the steps of film forming and patterning.

Thus, even though pinholes occur during deposition or patterning of individual layers, there is only a small probability that two or more pinholes will occur at the same place. The risk of short circuits caused by pinholes is therefore substantially reduced.

BRIEF DESCRIPTION OF THE DRAWINGS

FIG. 3(a) is a plan view, and FIG. 3(b) is a sectional view taken along the line B—B in FIG. 3(a).

DESCRIPTION OF THE PREFERRED EMBODIMENTS

Figure 1:
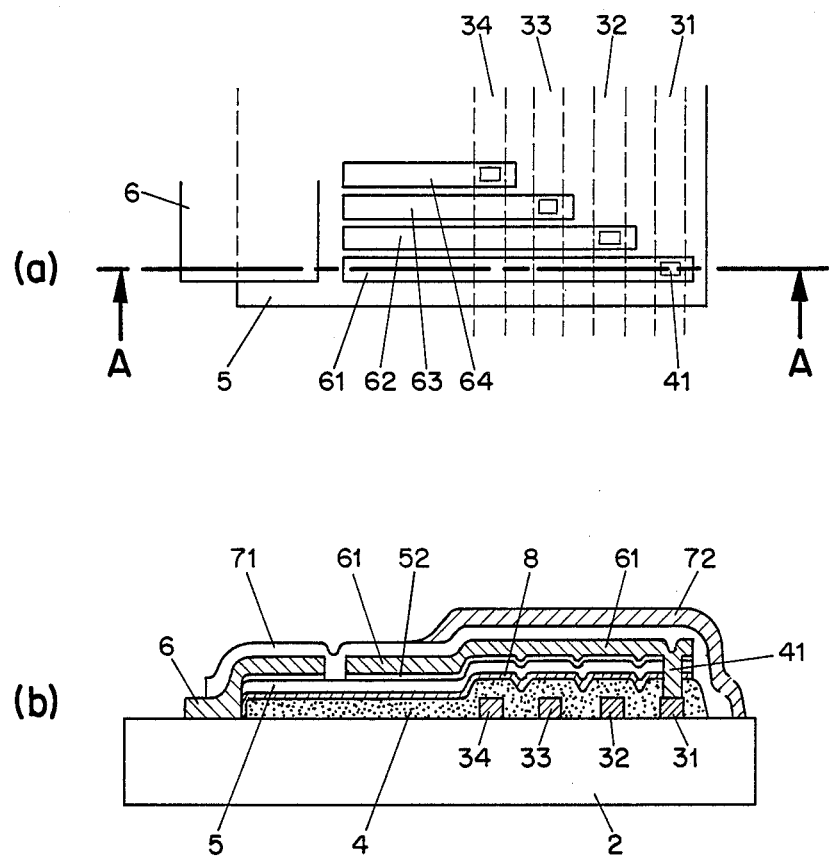
FIG. 1(a) is a plan view and FIG. 1(b) is a sectional view taken along the line A—A in FIG. 1(a), both showing the linear image sensor in one embodiment of the present invention.
Figure 2:
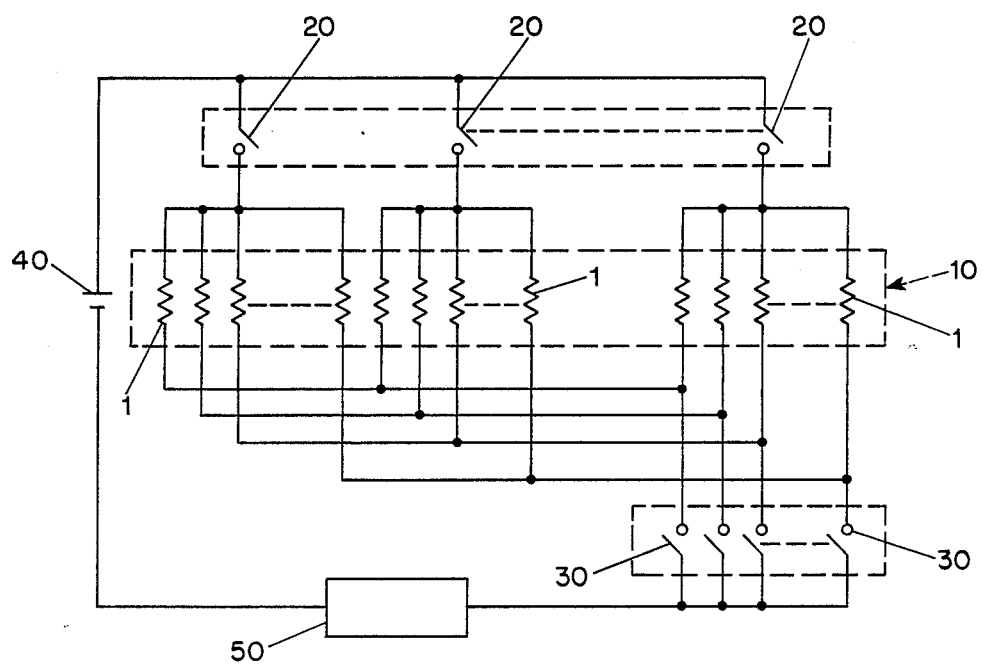
FIG. 2 is a circuit diagram illustrating how a conventional contact-type linear image sensor performs matrix reading.
Figure 3:
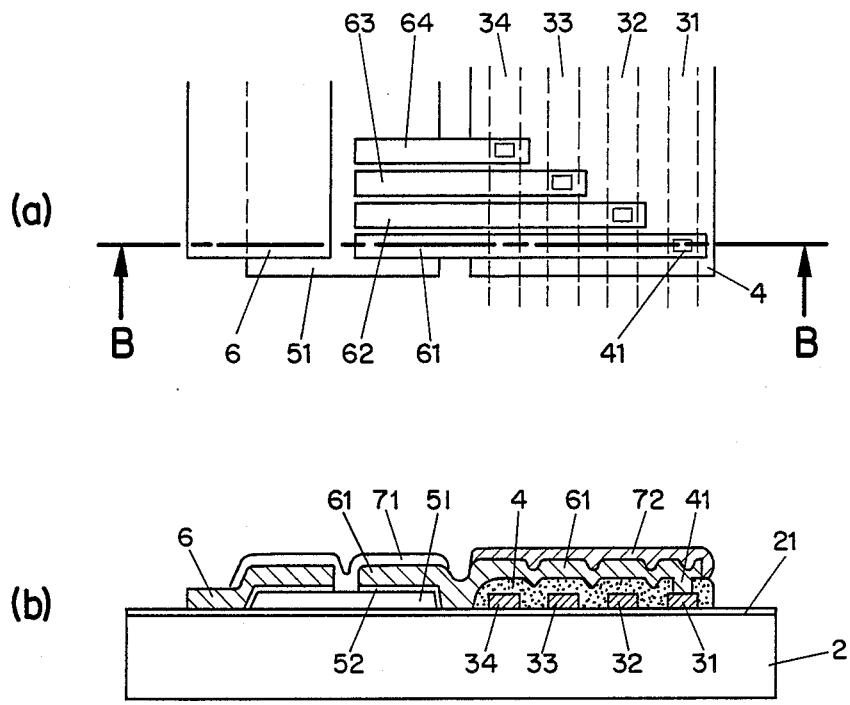
FIG. 3 is a conventional linear image sensor based on amorphous silicon.
Figure 4:
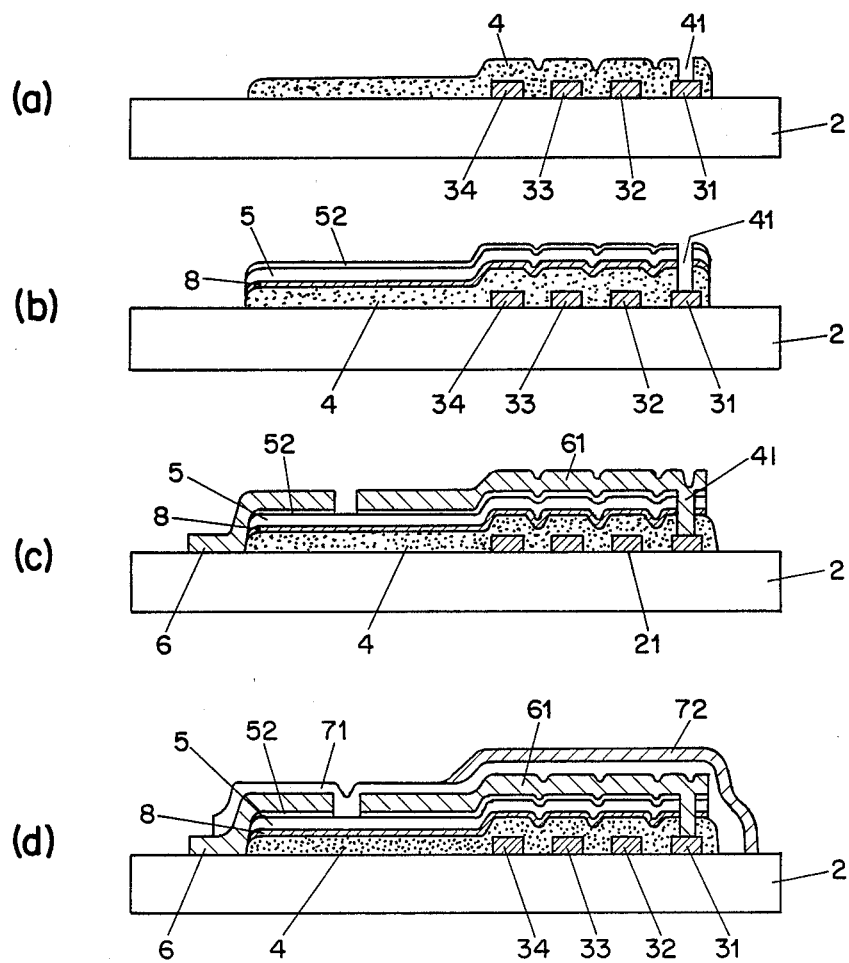
FIGS. 4(a), 4(b), 4(c) and 4(d) are sectional views illustrating the steps of producing the sensor as shown in FIG. 1.

An example of the invention is explained with reference to FIG. 1(a) and FIG. 1(b). The former is a plan view and the latter is a sectional view taken along the line A—A in FIG. 1(a). In FIG. 1 and FIG. 3, like reference characters designate like or corresponding parts. With regard to FIG. 1, a soda glass substrate 2 is provided, which need not be coated by a SiO$_2$ film as in the prior art structure. On the substrate are formed metal matrix electrodes 31, 32, 33, 34 of chromium. The matrix electrodes 31, 32, 33, 34 are covered with a silicon nitride (SiN) film 4, and the SiN film 4 further extends beneath the entire photosensor array. The SiN film 4 is covered with SiC film 8, which is in turn covered with an a-Si film 5. The a-Si film 5 is connected to a metal electrode 6 and to the leader electrodes 61, 62, 63, 64 via an n-type a-Si film 52. The common metal electrode 6 is connected to switches 20 as shown in FIG. 2. The leader electrodes 61, 62, 63, 64 are connected to the matrix electrodes 31, 32, 33, 34 respectively, through the contact hole 41 which is formed through the several layers formed over the matrix electrodes, i.e., the SiN film 4, the SiC film 8, the a-Si film 5, and the n-type a-Si film 52. The a-Si film 5 and the n-type a Si film 52 are disposed over the entire photosensor array, and are beneath the leader electrodes 61, 62, 63, 64. The entire array is then covered by a transparent protective film 71 of SiN or epoxy resin, which is extended to also cover the matrix electrodes. The matrix electrodes are further covered with an opaque protective film 72 above the transparent protective film 71.

The linear image sensor described above can be produced according to the steps shown in FIGS. 4(a) to 4(d). First, a glass substrate 2 is coated with a metal such as chromium to a thickness of 1000 to 5000 Å by evaporation or sputtering. Striped matrix electrodes 31, 32, 33, 34 are formed by photolithography. On the striped matrix electrodes is formed a SiN film 4 (1000 Å to 1 μm thick) by glow discharge decomposition of a 1:3 gaseous mixture of ammonia ($NH_3$) and silane ($SiH_4$). The SiN film 4 is patterned using $SF_6$ gas by photolithography to make the connecting hole 41. (See FIG. 4(a).)

Then, on the SiN film 4 a SiC film 8 (1000 to 5000 Å thick) is formed by glow discharge decomposition of silane containing 20-80% of acetylene ($C_2H_2$). On the SiC film 8 are further formed, one over the other, an a-Si film 5 (1000 to 5000 Å thick) by glow discharge decomposition of silane containing 100 ppm or less of phosphine, and an n-type a-Si film 52 (100 to 500 Å thick) by glow discharge decomposition of silane containing 0.5 to 2% of phosphine. The laminated films are patterned using $SF_6$ gas or $CF_4$ gas containing oxygen by photolithography to make the extension for the connecting hole 41. (See FIG. 4(b).)

In another embodiment of the present invention, the patterning of the SiN film 4 was followed by the deposition of an SiN film (1000 to 5000 Å thick) in place of the SiC film 8. The subsequent steps were carried out in the same manner as described above to form the a-Si film 5, the n-type a-Si film 52, and the extension of the connecting hole 41.

In a further embodiment of the present invention, both of the insulating films 4 and 8 were SiC films. The SiC films were formed by glow discharge decomposition of a mixed gas of $C_2H_2$ and $SiH_4$, with the mixing ratio adjusted so that the C/Si ratio was 10 to 30% (The $C_2H_2$ may be replaced by methane, ethane, propane, and other hydrocarbons). The patterning (etching) of the SiC film by photolithography was carried out by using $SF_6$ gas or $CF_4$ gas containing several percent of oxygen.

On the multi-layer films formed as described above were formed the common electrode 6 and the individual leader electrodes 61, 62, 63, 64 from chromium or other metals by sputtering or electron beam vaporization, followed by patterning by photolithography. Using the thus formed electrode pattern as a mask, the n-type a-Si film 52 was etched in a plasma of $SF_6$ gas or $CF_4$ gas containing oxygen. (See FIG. 4(c).)

Finally, on the electrodes were formed a transparent protective SiN film 71 by plasma decomposition of a silane-ammonia mixed gas, using a mask which permits the end of the common electrode 6 and the respective ends (not shown) of the matrix electrodes 31, 32, 33, 34 to be exposed for connection to the outside circuits. The transparent protective SiN film was coated, followed by baking, with an opaque epoxy resin by printing to form the protective film 72. (See FIG. 4(d).)

In the above-mentioned embodiments, the insulating layer of the matrix electrodes was formed by repeating the film formation and patterning twice each. As the result, the fraction defective attributable to short circuits in the matrix circuits was reduced. With the a-Si film 5 and transparent protective film 71 extended above the matrix circuits, the insulation and protection of the matrix circuits are enhanced and this leads to the decrease in the number of defectives to below 20%. The above-mentioned process can be carried out without any substantial increase in steps because the SiC film 8 or the second SiN film can be formed simply by replacing the gas in the same CVD apparatus used for the formation of the SiN film 4 or the a-Si films 5 and 52. Moreover, in the above-mentioned examples, the SiN insulation film 4 is extended underneath the photosensor array. This makes it unnecessary to cover the substrate 2 of soda glass with an $SiO_2$ film because it holds back sodium.

Figure 5:
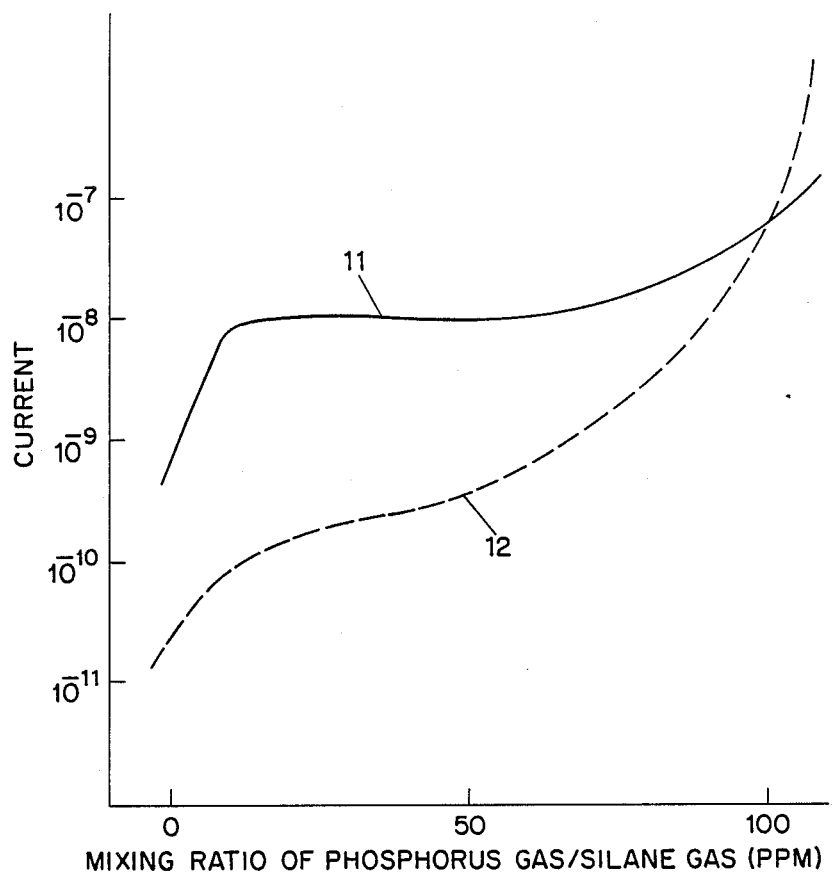
FIG. 5 is a graph showing the relationship between the photoconductivity and the amount of phosphorus added to the photoconductive a-Si film.

In the above-mentioned examples, the a-Si film 5 was incorporated with a trace amount of phosphorus to increase the sensitivity of the photosensor. FIG. 5 shows the relationship between the amount of phosphorus (in terms of phosphine gas (in ppm) in silane gas used for the formation of the a-Si film 5) and the electric current induced by a bias voltage of 1 V under irradiation (100 lx) from a light emission diode (wavelength 565 nm). The broken line 12 represents the dark current. It is noted that the addition of a small amount of phosphorus is effective in the increase of sensitivity. It is also noted that the dark current increases with the amount of phosphorus doped. With the amount of phosphorus doped in the range of 5 to 70 ppm, preferably 10 to 50 ppm, the sensor has an increased sensitivity, giving a sufficiently high ratio of signal current to dark current. Thus the present invention overcomes one of the disadvantages involved in the conventional products, namely that the signal current is too small (about 10 nA under 1000 lx) to process without difficulties.

The insulating film of SiC is advantageous over the insulating film of SiN in that it keeps a stable surface when a photoresist is applied and it is etched accurately. This advantage leads to a decrease in fraction defective. In the embodiment in which the SiC films were formed in two layers, the fraction defective was 17%.

Despite the fact that the SiC film has slight photoconductivity, the image sensor of the present invention has good characteristics on account of the opaque protective film 72 which shields the incident light. If there is a possibility of light entering through the glass substrate 2, it is desirable to shield the glass surface opposite to the matrix electrodes.

The number of the insulating films laminated on top of the other is not limited to two. The greater the number of the insulating films, the more certain it is to prevent short circuiting caused by overlapped pinholes, although the number of steps increases. The effective insulating film may be made of $SiO_2$ and other materials.

The linear image sensor of the present invention is characterized in that multi-layer insulation films formed by repeating evaporation and patterning separate the leading electrodes of linearly arranged a-Si photodetecting resistors from the matrix electrodes connected to their respective switches. This structure contributes to reducing the fraction defective arising from the short circuits in the insulating layer, without substantial increase in production steps.

I claim:

1. A linear image sensor comprising a substrate having disposed thereon a common electrode and a linear array of a plurality of detecting elements, each detecting element comprising
   (a) a photodetecting resistor in electrical contact with said common electrode;
   (b) a matrix electrode adjacent to the photodetecting resistor, said matrix electrode being adapted for connection to an external circuit;
   (c) an insulating layer disposed over a portion of said matrix electrode and having a window formed therein coincident with said matrix electrode; and
   (d) a leader electrode disposed over said insulating layer, said leader electrode making electrical contact with said matrix electrode through the window in the insulating layer and further making electrical contact with the photodetecting resistor, but not making direct electrical contact with said common electrode, wherein the insulating film comprises a plurality of separately formed layers, one over another.

2. A linear image sensor as claimed in claim 1, wherein the photodetecting resistors comprise a film of n-type amorphous silicon.

3. A linear image sensor as claimed in claim 2, wherein the films of the insulating layer comprise materials selected from the group consisting of amorphous silicon, silicon nitride and silicon carbide.

4. A linear image sensor as claimed in claim 2, wherein the amorphous silicon film constituting the photodetecting resistors contains 5 to 70 ppm of phosphorous.

5. A linear image sensor comprising a substrate having disposed thereon a common electrode and a linear array of a plurality of detecting elements, each detecting element comprising:
   (a) a photodetecting resistor in electrical contact with said common electrode;
   (b) a matrix electrode adjacent to the photodetecting resistor, said matrix electrode being adapted for connection to an external circuit;
   (c) an insulating layer disposed over a portion of said matrix electrode and having a window formed therein coincident with said matrix electrode; and
   (d) a leader electrode disposed over said insulating layer, said leader electrode making electrical contact with said matrix electrode through the window in the insulating layer and further making electrical contact with the photodetecting resistor, but not making direct electrical contact with said common electrode, wherein the insulating film comprises a plurality of separately formed layers, one over another; and
   wherein the photodetecting resistor is one layer of the insulating layer and extends over the matrix electrode.

6. The linear image sensor of claim 5, wherein the photodetecting resistor comprises a film of n-type amorphous silicon.

7. A linear image sensor as claimed in claim 5 wherein a transparent protective film is disposed above the entire leader electrode.

8. A linear image sensor as claimed in claim 6, wherein one or more layers of the insulating film in addition to the n-type amorphous silicon film extend beneath the leader electrodes.

* * * * *